United States Patent
Abraham et al.

(10) Patent No.: US 6,246,011 B1
(45) Date of Patent: Jun. 12, 2001

(54) SOLDER JOINT RELIABILITY

(75) Inventors: Ian Andrew Abraham, Bishop's Stortford; Andrew Siu Hing Liu, Epping Green, both of (GB)

(73) Assignee: Nortel Networks Limited, Montreal (CA)

( * ) Notice: Subject to any disclaimer, the term of this patent is extended or adjusted under 35 U.S.C. 154(b) by 0 days.

(21) Appl. No.: 09/203,850

(22) Filed: Dec. 2, 1998

(51) Int. Cl.[7] .................................................... H05K 1/16
(52) U.S. Cl. ................................ 174/260; 174/35 R
(58) Field of Search ................... 174/260, 35 R, 174/36, 35 C; 361/760, 782, 783, 767, 768, 769, 770, 771, 772, 773

(56) References Cited

U.S. PATENT DOCUMENTS

| | | |
|---|---|---|
| 5,484,964 * | 1/1996 | Dawson et al. .................... 174/261 |
| 5,639,013 | 6/1997 | Jairazbhoy et al. . |
| 5,790,377 * | 8/1998 | Schreiber et al. ................... 361/704 |
| 5,874,780 * | 2/1999 | Murakami ........................... 257/775 |
| 6,101,099 * | 8/2000 | Olsson ................................. 361/761 |

* cited by examiner

*Primary Examiner*—Jeffrey Gaffin
*Assistant Examiner*—Jeremy Norris
(74) *Attorney, Agent, or Firm*—Lee, Mann, Smith, McWilliams, Sweeney & Ohlson (57) ABSTRACT

An electrical circuit arrangement comprising a circuit board and an electrical component attached thereto by a plurality of solder joints. The sizes of the joints are chosen according to a characteristic (for example the frequency) of signals to be conducted through them. The joint sizes are inversely proportional to the frequency of signals which they are arranged to conduct. The expected fatigue life of the arrangement is greater than one in which all joints are of a smaller size, as required for example for high frequency signals, and this reduces the need for component underfill.

12 Claims, 8 Drawing Sheets

SOLDER JOINT RELIABILITY

FIELD OF THE INVENTION

The present invention relates to a method for improving electrical equipment reliability by use of improved solder jointing techniques.

BACKGROUND TO THE INVENTION

Solder joints serve three functions: physical attachment of electronic components (for example peripheral packages) to a circuit board, completion of an electrically conductive path from the circuit component to the board, and provision of a thermally conductive path between the electronic component and the board. These functions may have conflicting requirements.

For physical attachment of electronic components it is typically the case that longer fatigue life may be achieved by use of larger solder joints. Such fatigue is caused by thermal expansion mismatch between the component and the circuit board. Similarly, larger solder joints typically improve thermal conductivity between component and board.

Use of smaller solder joints, whilst advantageous with respect to electrical conductivity for high frequency signals, has the disadvantage that resistance to solder joint fatigue failure may be reduced. It is also difficult to align small solder joints during re-flow in manufacture.

A known approach to improving package reliability with respect to solder joint fatigue is to underfill components with an epoxy resin (or other substance having similar adhesive, non-electrically-conductive properties) in order to constrain movement of a package relative to a board. This results in additional production processes—underfill dispensing and curing, either by heating or by ultra-violet irradiation—adding to time and cost of manufacture. The use of epoxy underfill also makes subsequent re-work more difficult and, in particular, precludes simple re-soldering.

It is known to provide strain relief for corner joints between an electronic component and a board by enlarging the solder joints at those corner joints.

U.S. Pat. No. 5,639,013 discloses a method for improving reliability of solder joints by forming convex solder joints having increased pedestal height.

OBJECT TO THE INVENTION

The invention seeks to provide a method for improving the reliability of solder joints for electrical components having high frequency interconnections and for improving the alignment of such joints during manufacture.

The invention also seeks to provide more reliable electrical apparatus.

SUMMARY OF THE INVENTION

According to a first aspect of the present invention, there is provided an electrical circuit arrangement comprising a circuit board and a surface-mount electrical component attached thereto by a plurality of electrically-conductive joints, wherein one dimension of one of said joints is predetermined from a characteristic of a signal to be conducted through said joint.

Preferably also, a dimension of a number of joints is predetermined from a characteristic of respective signals to be conducted through said joints.

Preferably, said characteristic of a signal is the frequency of said signal.

Preferably, the size of said one dimension of said joint is determined to be inversely proportional to the frequency of an electrical signal to be conducted through said joint.

Preferably, the dimension is the length of the joint.

Preferably, the arrangement is such that a first joint is positioned adjacent to at least one larger joint whereby to afford strain relief to said first joint.

More preferably, the arrangement is such that said first joint is positioned adjacent at least two larger joints.

Preferably, said first joint is arranged, in operation, to conduct high frequency electrical signals. Said high-frequency electrical signals may be radio frequency signals.

Said larger joint may be arranged, in operation, to form part of an electrical grounding or shielding member.

Advantageously, the benefits of small joint sizes for high-frequency signals are realised.

Advantageously, the benefits of large joint sizes for ground connections are realised.

Advantageously, expected fatigue life of relatively smaller joints is increased.

Advantageously, the presence of larger solder joints improves thermal conductivity between the components for improved heat dissipation in operation.

The joints may be of solder or of electrically-conductive adhesive.

The invention also provides for a system for the purposes of telecommunication (including wireless telecommunication) which comprises one or more instances of apparatus embodying the present invention, together with other additional apparatus.

According to a further aspect of the present invention, there is provided a method for improving the reliability of solder joints comprising the steps of: providing first and second components to be soldered together; providing solder; applying predetermined volumes of said solder to each of a plurality of connection points on at least one of said components; juxtaposing the components so as to locate the solder between and in contact with both components; re-flowing the solder; allowing the solder to cool whereby to form solid solder joints each providing at least one of physical, thermal, and electrical connection, between the components; and wherein a dimension of one of said joints is predetermined from a characteristic of a signal to be conducted through said one of said joints.

Preferably, the volume of solder at each connection point is inversely proportional to the frequency of electrical signals to be carried.

Preferably, the solder is applied in paste form.

The solder paste may be applied by screen printing, plating, jetting, direct dispensing, or stamping.

The solder may be applied to one component only.

One of said components may comprise a circuit board.

Preferably, the solder is applied to the circuit board.

One of said components may comprise one of a peripheral package, a ball-grid, and a pin-mount package.

The solder may be applied to the component.

Preferably, the solder, when re-flowed, exerts a net force such that the components are buoyant with respect to each other.

Advantageously, the use of larger solder joints to constrain smaller critical signal connections improves the manufacturing process, by increasing the degree of self-alignment brought about by solder surface tension during re-flow, thus facilitating the difficult task of aligning small solder joints consistently.

Advantageously, assembly and materials costs are reduced compared with traditional underfill techniques.

According to a further aspect of the present invention, there is provided a method for improving the reliability of conductive adhesive joints comprising the steps of: providing first and second components to be glued together; providing electrically-conductive adhesive; applying predetermined volumes of said adhesive to each of a plurality of connection points on at least one of said components; juxtaposing the components so as to locate the adhesive between and in contact with both components; allowing the adhesive to set whereby to form solid joints each providing at least one of a physical, thermal, and electrical connection, between the components; and wherein a dimension of one of said joints is predetermined from a characteristic of a signal to be conducted through said one of said joints.

In a preferred embodiment, joints are arranged across the rim of the package radially relative to the centre of the package. However in some situations a grid layout of joints oriented orthogonally with respect to the package edge is more convenient for circuit board layout.

The preferred features may be combined as appropriate, as would be apparent to a skilled person, and may be combined with any of the aspects of the invention.

BRIEF DESCRIPTION OF THE DRAWINGS

In order to show how the invention may be carried into effect, embodiments of the invention are now described below by way of example only and with reference to the accompanying figures in which.

DETAILED DESCRIPTION OF INVENTION

Figure 1:
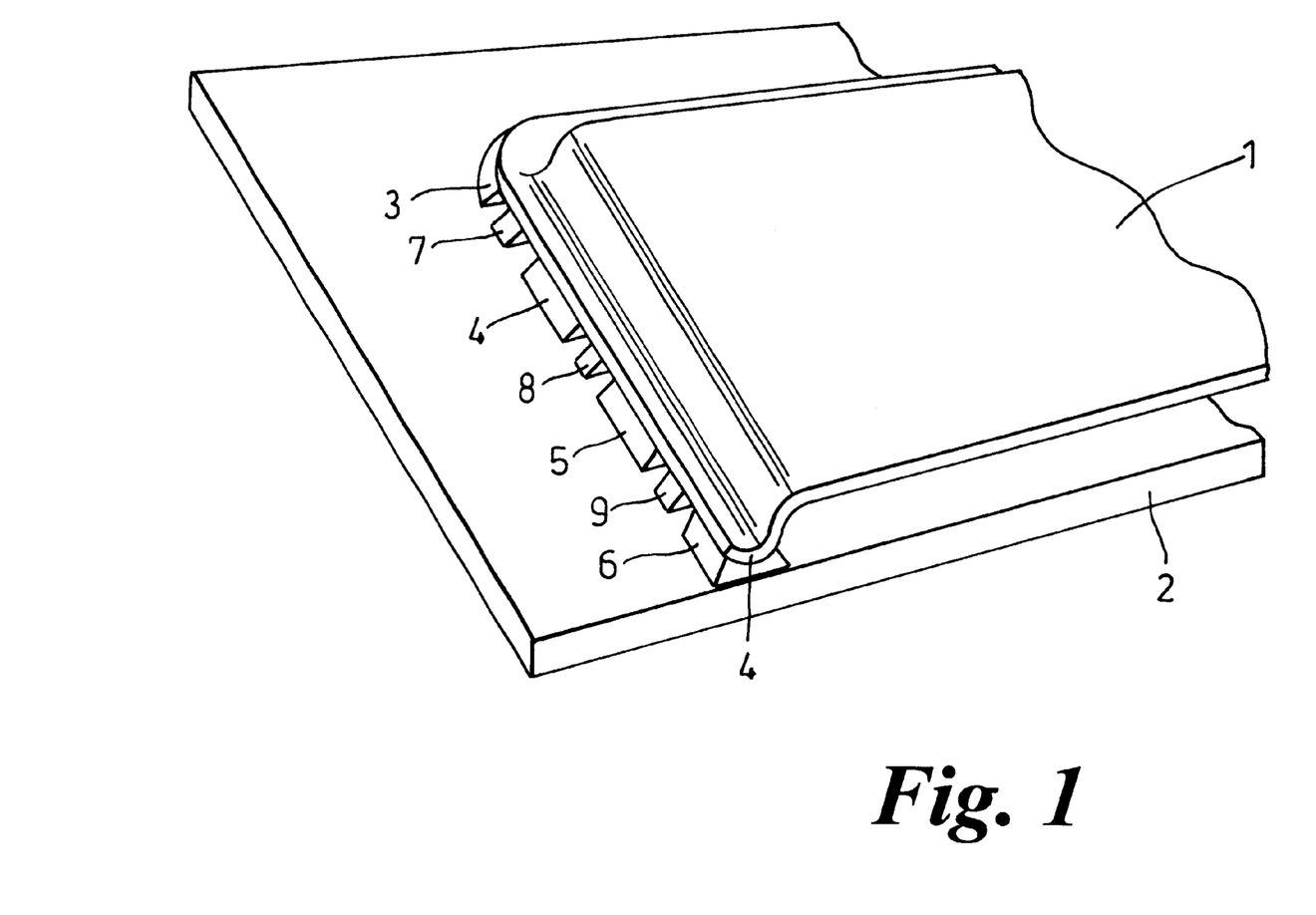
FIG. 1 shows a cut-away perspective view of a peripheral package mounted on a circuit board.

FIG. 1 shows a cut-away view of a surface-mount peripheral package 1 attached around its rim 11 to a printed wiring board (PWB) 2 (or circuit board) by means of a plurality of solder joints 3–9.

The solder joints, in addition to providing the physical attachment of package to board, form electrical connections between a first circuit portion located on the underside of the package and a second circuit portion located on the circuit board surface. Electrical connection may also be provided between the outer surface of the package and the circuit board for the purpose of providing electrical grounding whereby to provide electromagnetic shielding of the circuit enclosed by the package.

Figure 2:
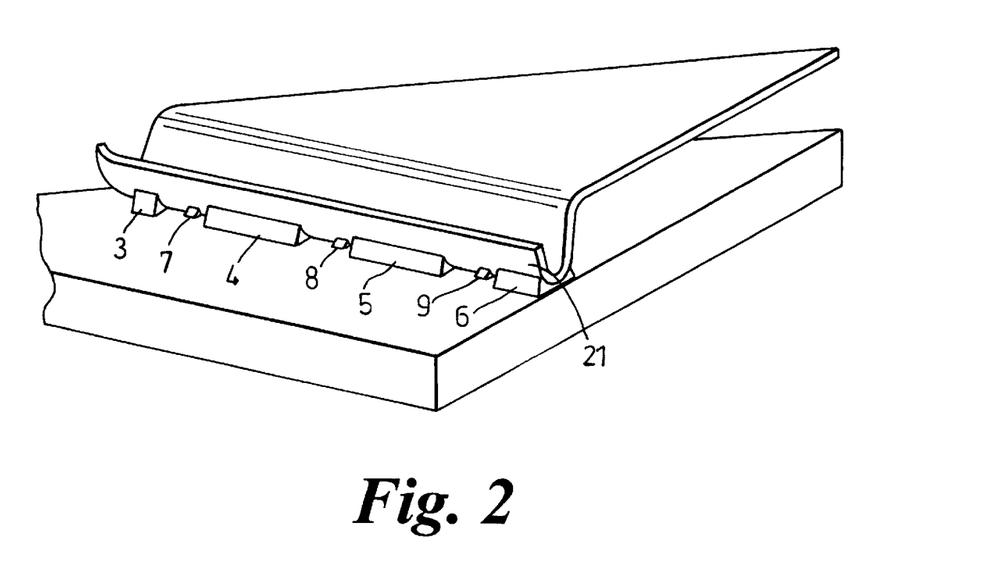
FIG. 2 shows a cut-away view of the same arrangement showing solder joints in accordance with the present invention as viewed from outside the package.
Figure 3:
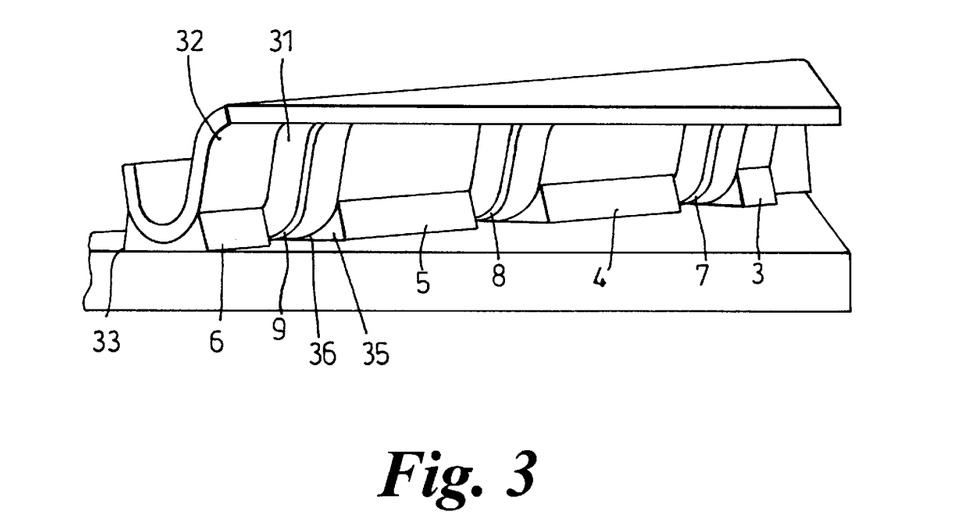
FIG. 3 shows a cut-away view of the same arrangement showing solder joints in accordance with the present invention as viewed from within the package.

Referring now to FIGS. 2 and 3, there are shown views of a portion of the arrangement shown in FIG. 1, comprising a one eighth portion of the peripheral package. In each case a perspective view is shown, revealing the outer face 21 and inner face 31 of the rim 11 of the package respectively. Seven solder joints are shown: four large 3–6 and three small 7–9. The larger joints connect ground tracks 32, printed on the underside of the package, via PWB pads 33 to ground contacts on the underlying circuit board. Similarly, the smaller joints connect tracks 35, printed on the underside of the package and arranged for carrying high frequency signals, via PWB pads 36 to high frequency tracks on the underlying printed circuit board. The relatively larger joints may be positioned at any point around the rim of the package and, as shown, are not limited to occur at corners of the package. In a preferred embodiment, at least one such larger joint occurs at a point other than a corner of the package.

Adequate inter-track separation is provided between signal-carrying tracks and ground tracks as would be apparent to one skilled in the art.

Figure 4:
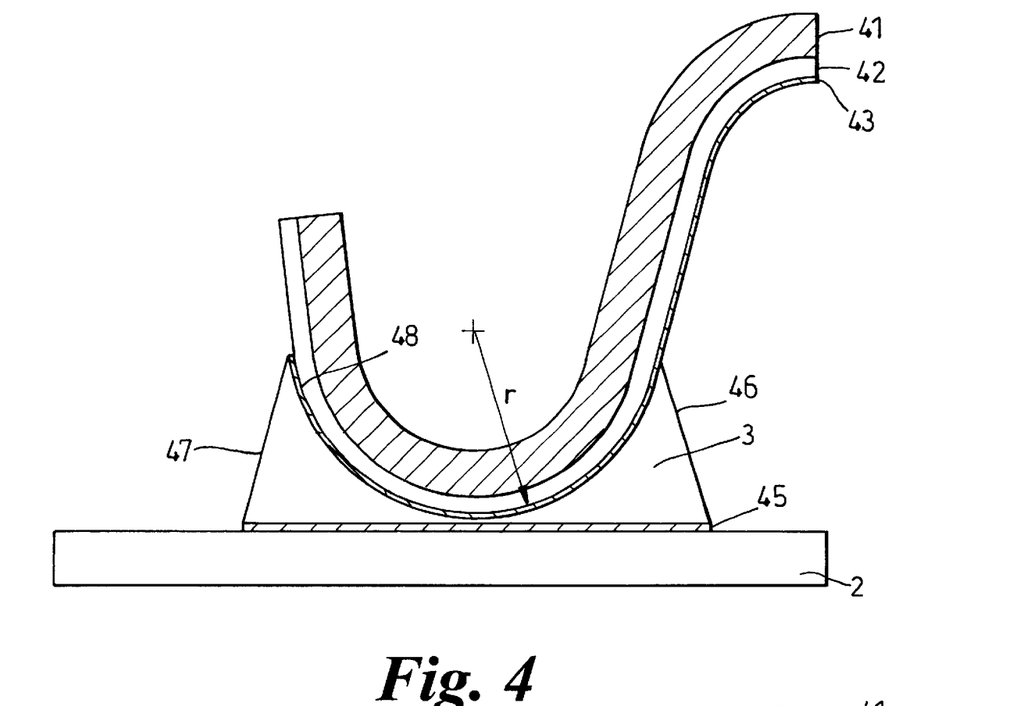
FIG. 4 shows a cross sectional view of one side of the same arrangement, through a large solder joint.
Figure 5:
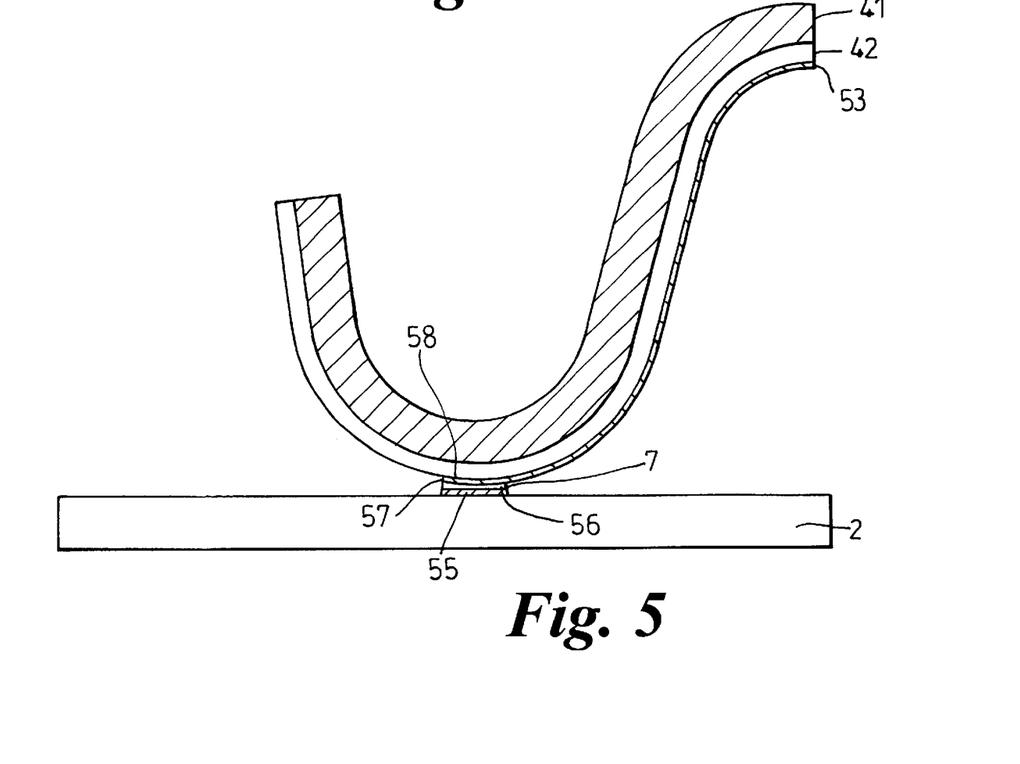
FIG. 5 shows a cross sectional view of one side of the same arrangement, through a small solder joint.

Referring now to FIGS. 4 and 5 there are shown two cross-sectional views of one side of the arrangement, through a large 3 and a small 7 solder joint respectively. The package construction comprises a base 41 which provides both mechanical support and electromagnetic shielding, on the underside of which there is provided an electrically insulating substrate 42, with conductive tracks 43, 53 printed on the lower surface of the substrate, thereby electrically insulated from the base.

Conductive tracks 43 arranged to act as ground tracks may be connected to the base by means of metal plated vias in the substrate. An alternative approach is to provide an opening in the insulation substrate 42 to allow the solder joints 3–6 to connect directly to the base 41.

The base 41 provides mechanical support for the package. The base is typically of an electrically conductive material, for example copper, whereby it can provide electromagnetic shielding to the enclosed circuit.

The solder joints 3, 7 are formed between the tracks 43, 53 and the PWB pads 45, 55 located on the PWB. The variation in joint size is achieved by selecting differing sizes of solder pad 45, 55, and applying differing amounts of solder, the latter being easier where solder is applied in paste form. If a solder wave or bath process is used, then the size of joint will be predominantly determined by the pad sizes.

The section shown in FIG. 4 is of a larger joint arranged for connection to a low-frequency or ground track 43, whilst that of FIG. 5 is of a small joint arranged for connection of a track arranged to carry high-frequency signals. Whilst the figures, for simplicity, show the inward-facing 46, 56 and outward-facing 47, 57 faces of each joint as being flat, in practice these may range from concave through to convex dependent on the volume of solder deposited.

In a preferred embodiment, such faces are arranged to be concave, corresponding to the case in which relatively smaller volumes of solder are deposited in each case, since this configuration gives rise to lower solder stress concentrations than the flat or convex cases.

For high frequency (for example radio frequency) applications, it is desirable to limit the size of the solder joints for certain critical signal connections. Smaller solder joints reduce the intrinsic capacitance and inductance of the interconnection, thus allowing higher frequency operation. It is also desirable to avoid discontinuities in impedance, which would result in reflected signal losses. Where it is not possible to achieve a good impedance match, it is necessary to keep the size of these discontinuities to a minimum.

The preference of small joints for joints arranged to carry high-frequency signals arises since large joints used for that purpose give rise to undesirable radiation of the high-frequency signals from the outer-face of the joint, and these radiated signals may interfere with other adjacent circuits. By reducing the sizes of the joints in these cases, such emissions can be reduced to acceptable levels. Use of such larger joints in high-frequency signal paths would also facilitate undesirable coupling of incoming high-frequency signals to these paths. In the case of large joints arranged to provide grounding, coupling of incoming high frequency signals is minimised by ensuring that a low impedance path is provided to ground.

Note that in addition to reducing the joint size, the track stub 58 for high-frequency tracks is correspondingly reduced in length with respect to the track stub 48 in the ground or low-frequency case, so as to avoid unwanted emissions from the track itself on the outward face 21 of the package.

Figure 6:
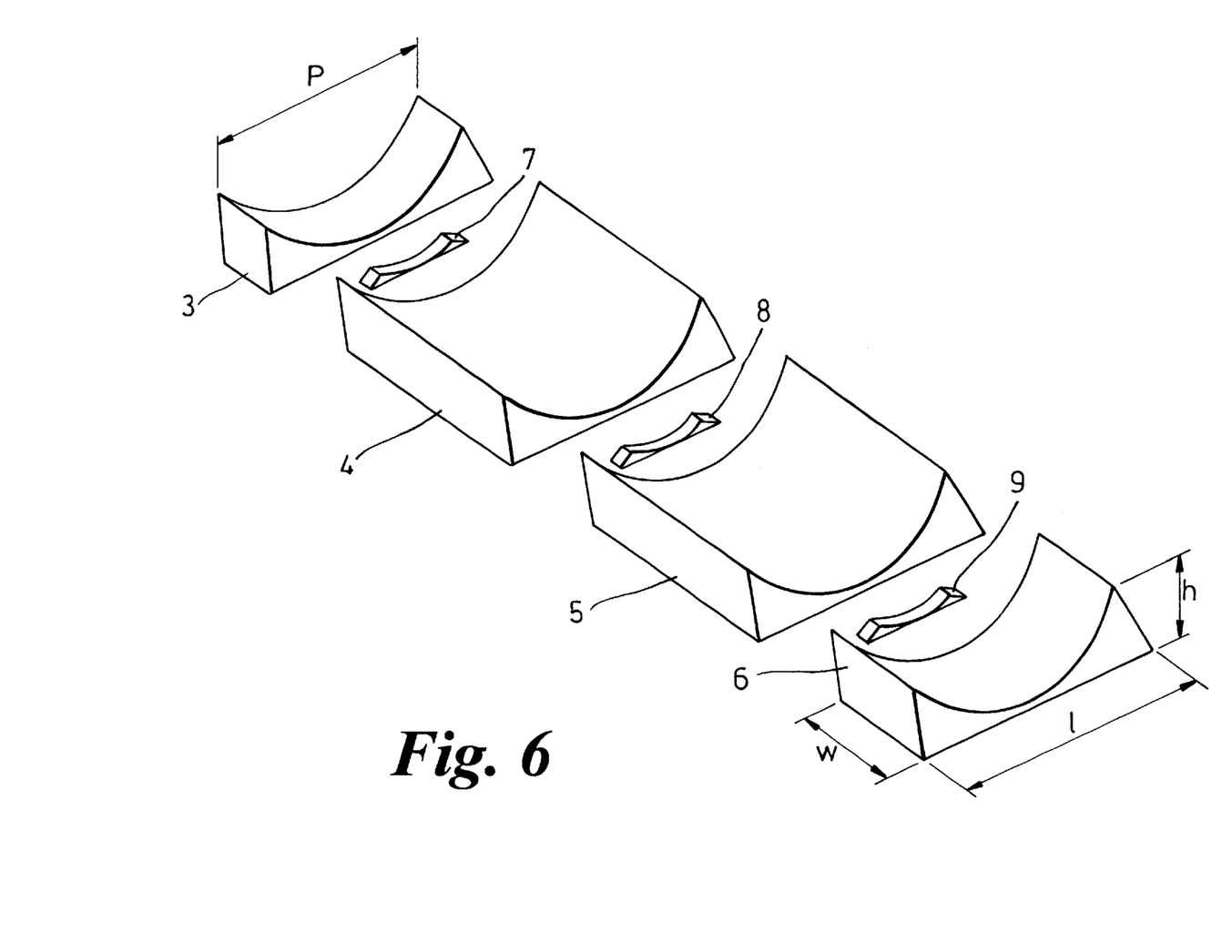
FIG. 6 shows a cut-away perspective view of solder joints in accordance with the present invention.

FIG. 6 shows a cut-away perspective view of the same portion of the present embodiment showing only the joints 3–9 as they would be formed between board and package. The width (w), length (l) and height (h) of the joints may be determined by the selecting different configurations of solder pads on the board and different track widths and lengths on the package, together with the application of solder resist in a conventional way. The peak-to-peak distance (p) between the solder joint peaks is also affected by the radius of curvature (r) of the rim of the package, indicated in FIG. 4.

The widths (w) of the solder joints 3–9 may be limited in practice both by the physical dimensions of the circuit tracks to be connected and by the dimensions of the inter-track gaps necessary to ensure electrical isolation between tracks. However the track separation does not constrain the other dimensions—length (l) and height (h)—of the joints.

By adjusting the size and shape of the package mounting pads and the volume of solder deposited, the size and shape of the individual solder joints can be controlled. This variation in the size and shape affects the expected solder fatigue life of the individual joints: the larger joints, although providing greater mechanical strength and resistance to solder fatigue, adversely affect electrical performance if used for high-frequency connections, leading to unwanted radiation of high-frequency signals; smaller joints, although they provide good high-frequency connection performance with reduced radiation, exhibit lower resistance to physical stresses, leading to a reduction in the expected solder fatigue life.

By employing relatively smaller solder joints 7–9 to form connections arranged to carry high frequency signals, but employing relatively larger joints 3–6 to form connections arranged to carry lower frequency signals (including ground), the twin benefits of stress relief and improved high frequency electrical connection can be achieved simultaneously.

Preferably, smaller high-frequency joints are positioned adjacent at least one, if not two, larger low-frequency joints. In the embodiment shown each high-frequency joint is shown adjacent two larger joints.

The use of the relatively larger joints where high-frequency electrical performance is not important, whilst retaining the use of relatively smaller joints for high-frequency connections, helps to constrain movement of the package body as a whole. The presence of the larger solder joints in proximity to the smaller high-frequency joints also acts to reduce the stress on the smaller joints, thereby extending the expected fatigue life of the solder joints as a whole beyond that which would be achieved by using smaller joints for all joints whether for low or high frequency connections. The resultant expected fatigue life of the arrangement utilising both large and small solder joints lies between the life expectancy associated with the smaller joints and that of the larger joints.

The larger joints may also be employed even in circumstances where there is no specific electrical need for a connection, though typically the larger joints would be arranged to provide both improved electrical grounding of the package and effective electromagnetic shielding around the join between the peripheral package and the board.

Analysis of an embodiment of the present invention using the known numerical technique of Finite Element Analysis (FEA) to predict the thermal and mechanical response of structures exposed to various environmental conditions shows that, for the examples examined, expected fatigue life of alternate small and large joints had an expected fatigue life 77% greater than that of a similar arrangement in which all joints were of the same dimensions as the smaller joints. FEA is a recognised alternative to the construction, testing, and rebuilding of multiple prototypes.

A geometric model was constructed and analysed for each of five arrangements of solder joints: four models having joints of uniform height (h) and length (l) for all joints, and a fifth model representing the present embodiment with sizes of joint differing according to function. The cases are numbered 1–5 and the corresponding dimensions of joint base length (l) and peak-to-peak distance (p) given in Table 1.

TABLE 1

Joint Case Numbers and Dimensions

| Joint Case | Joint Dimensions (mm) | |
| --- | --- | --- |
| 1 | p = 1.53 | l = 1.73 |
| 2 | p = 1.24 | l = 1.45 |
| 3 | p = 0.91 | l = 1.12 |
| 4 | p = 0.55 | l = 0.76 |
| 5 | signal joints: dimensions as per Case 4 | |
|   | ground joints: dimensions as per Case 1 | |

The other key dimensions in the present embodiments are constant: the radius of curvature (r) of the top surface of each solder joint is 0.802 mm and the minimum height of the solder joint (at the nominal midpoint of its length) is 0.025 mm. The width (w) of individual solder joints is also constant, the precise values used being depend on electrical functionality which is partitioned into 2 types: signal I/O's, and ground I/O's. For signal I/O's the joint width is 0.2 mm, and for ground I/O's the joint width is either 0.7 mm or 3.0 mm.

In joint Cases 1–4 constant p/l value pairs are employed both for signal and for ground joints, where l is the length of the base of the joint, and p is the peak-to-peak length of the top of each joint, as shown in FIG. 6. In joint Case 5, different p/l value pairs are employed for the signal and ground joints. Specifically, joints of the larger size used in Case 1 are employed for ground joints, and joints of the smaller size used in Case 4 are employed for high-frequency joints.

Figure 7:
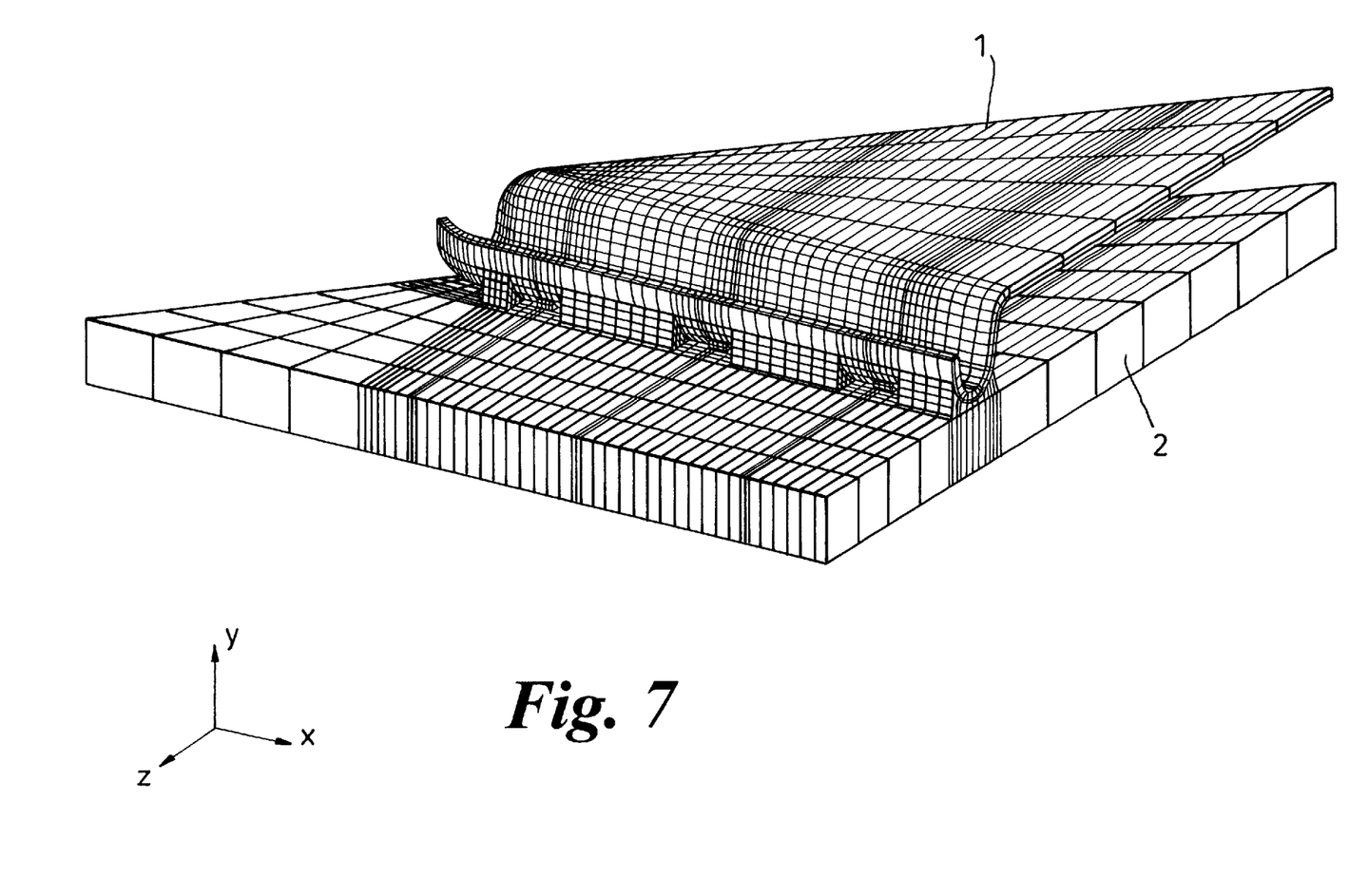
FIG. 7 shows a representation of the geometric model of the present embodiment in accordance with the present invention subdivided into a mesh of elements.

A representation of the geometric model of the present embodiment, sub-divided into a mesh of elements, as illustrated in FIG. 7, along with an indicator showing reference axes, X, Y, and Z, relative to which dimensions of component parts are defined below: Y is nominally vertical axis with respect to the plane of the PWB, X is nominally horizontal parallel to the line of joints, and Z is also nominally horizontal, orthogonal to the line of joints.

To reduce the complexity of the model, a one-eighth symmetry strategy was used, as illustrated in FIG. 7, applied to the whole assembly. The finer the mesh into which the geometric model is divided (that is, the smaller the elements), the more capable the FEA is in accounting for small geometric details. Smaller meshes were employed for and around the smaller joints, as FIG. 7 shows.

The elastic material and geometric properties associated with each component of the arrangement in each case is shown in Table 2.

TABLE 2

Elastic Material and Geometric Properties

| Component | Material | Property | Material & Geometric Data |
|---|---|---|---|
| Package Base | Copper | Length × Width | 30.53 mm × 30.53 mm |
| | | Thickness | 0.200 mm |
| | | Elastic Modulus | 117 GPa |
| | | Poisson Ratio | 0.325 |
| | | CTE | 16.9 ppm/° C. |
| Package Substrate | Polyimide | Length × Width | 30.70 mm × 30.70 mm |
| | | Thickness | 0.084 mm |
| | | Elastic Modulus | 5 GPa |
| | | Poisson Ratio | 0.300 |
| | | CTE | 28.0 ppm/° C. |
| Package Track | Copper | Thickness | 0.018 mm |
| | | Elastic Modulus | 117 GPa |
| | | Poisson Ratio | 0.325 |
| | | CTE | 16.9 ppm/° C. |
| Solder Joint | 63Sn37Pb | Length × Width × Height | Depending on Joint Case |
| | | Minimum Height | 0.025 mm |
| | | Elastic Modulus | 75.9 − [0.152 × (Temp in ° K.)] GPa |
| | | Poisson Ratio | 0.35 |
| | | CTE | 24.5 ppm/° C. |
| Solder Pad | Copper | Length × Width | Depending on JOINT CASE |
| | | Thickness | 0.018 mm |
| | | Elastic Modulus | 117 GPa |
| | | Poisson Ratio | 0.325 |
| | | CTE | 16.9 ppm/° C. |
| Printed Wiring Board | FR4 | Length × Width | 41.0 mm × 41.0 mm |
| | | Thickness | 1.600 mm |
| | | Elastic Modulus: x/y/z | 16.5/7.2/16.5 GPa |
| | | Poisson Ratio (xy/xz/yz) | 0.39/0.11/0.39 |
| | | CTE (x/y/z) | 21.0/65.0/21.0 ppm/° C. |

The physical shape of the package in the present embodiment allows great flexibility both in terms of the number of input/output connections (I/Os) arranged around it and in terms of the shape of the corresponding solder joints. The specific embodiment illustrated comprises a single square package located centrally on a PWB, with 52 I/Os symmetrically placed around the perimeter of the package. The PWB is of a length and width to allow for at least a 5 mm board perimeter external to the package footprint, and is 1.645 mm (0.065 inch) thick.

The copper pads on the PWB, and which are used for joint attachment, are defined to have a length and width associated with the solder joint shape being assessed in each of five cases described herein, and a pad thickness of 0.045 mm.

The material properties (for example, that the PWB was constructed from FR4) were assigned to each element and specific load conditions (for example, that the temperature swing, $\Delta T$, was 35° C.) applied to those elements. The assigned finite element properties (for example relating to the physical dimension of the joint, or material characteristics) are chosen according to the specific arrangement modelled.

Data derived from the FEA and used to calculate the expected fatigue life of each arrangement includes stress values during each simulated thermal cycle, the corresponding Inelastic Strain values during each simulated thermal cycle, and the cyclic stress/strain points.

The cyclic stress/strain point data was used to define the SED value, which is used to derive the $N_f(50)$ value. The Lognormal Statistical Distribution may then be used to determine the $N_f(0.01)$ or 100 ppm value for a given shape factor, $\sigma$ (which is analogous to the $\beta$ value for the Weibull distribution).

There are 6.5 solder joints in the one-eighth symmetry model for a complete arrangement having 52 solder joints. The relatively low I/O count for a package of this size is partly due to the clearance between ground and signal tracks on the package substrate, which is required to minimise unwanted parasitic coupling effects. The signal to ground spacing defines the impedance of the track, in conjunction with the height of the track above the ground plane (i.e. the thickness of the dielectric). A separation of three times the track width is normally sufficient to avoid changing the microstrip impedance significantly. Therefore, for example, for a signal track width of 0.2 mm, the signal-to-ground track spacing is fixed at 0.6 mm. For a specific solder joint, the track width is equal to the corresponding solder joint width.

The Finite Element (FE) mesh modeling of the arrangement involves partitioning of the arrangement geometry into many small hex or wedge elements and analysis involves performing thermal and/or mechanical calculations for each of the vertices of the elements, giving eight calculation points (nodes) per element. These nodes are used to construct a contour plot over the whole model based on a range of parameters including stress, strain, and displacement.

For each of the joint cases, a three-dimensional FE model the arrangement was constructed and analysed using such 8-noded hex elements and 6-noded wedge elements. Table 3 shows the respective metrics for each case: number of elements, number of nodes, and number of elements per signal I/O.

TABLE 3

Geometric Model Metrics

| Joint Case Number | Number of Elements | Number of Nodes | No. of Elements per Signal I/O |
|---|---|---|---|
| 1 | 6359 | 9617 | 54 |
| 2 | 5989 | 9358 | 42 |
| 3 | 5719 | 9099 | 30 |
| 4 | 5449 | 8840 | 18 |
| 5 | 6097 | 9428 | 18 |

The differences in the number of elements and nodes between each case is attributable to the different number of elements representing the solder joint shapes and the associated PWB pads. FIG. 6 shows the mesh for Joint Case 5.

Isotropic, orthotropic, and anisotropic aspects of the materials from which the arrangement is constructed and to which elastic, plastic, and creep properties may be applied, were modelled.

The solder joints of the present embodiment are composed of eutectic 63Sn37Pb alloys. Since at room temperature (e.g. 25° C.=0.65$T_m$) the solder alloys are operating at above half of their absolute melting point ($T_m$), creep processes play a dominant part of the deformation behaviour of the solder. The relatively low yield stress values of the alloys means that creep and plastic deformation play a significant role for the majority of the loading cycle associated with both accelerated test and field use conditions. The total solder joint deformation, therefore, can be quantified using the inelastic (creep/plastic) strain value and the elastic strain value may be ignored as being insignificant.

The elastic material constants used in the analyses of the package assemblies for Cases 1–5 are listed in Table 2. In addition, all materials are assumed to be homogeneous except the FR4 substrate, which is assumed to be orthotropic in 3 dimensions. A solder deformation model, representing the inelastic behaviour of the solder joints using the hyperbolic creep equation (Equation 1):

$$\dot{\varepsilon}_{cr} = A[\sinh(Bq)]^n \cdot \exp\left[\frac{-\Delta H}{RT}\right] \quad (1)$$

was used, in which:
$\dot{\varepsilon}_{cr}$=Creep Strain Rate [$s^{-1}$].
A=Creep constant [$s^{-1}$].
B=Transient Creep Coefficient [$Pa^{-1}$].
q=Applied Stress [Pa].
n=Stress Exponent.
$\Delta H$=Activation Energy for Creep Deformation [$J.mol^{-1}$].
R=Universal Gas Constant=8.31 $J.mol^{-1}.K^{-1}$.
T=Temperature [K].

This equation is designed to model only creep deformation but Ball Grid Array (BGA) reliability work reported in "Reliability of Plastic Ball Grid Array Assembly", by Darveaux, R., Banerji, K., Mawer, A., Dody, G. in Ball Grid Array Technology, (ed. Lau, J. H., McGraw-Hill, USA, 1995, pp.379–442) proposes recommended constants for the AFEA creep equation that also account for time-independent plastic flow, and these were used in this analysis. The relevant creep constants, representing the 63Sn37Pb solder, are:
A=9.62E+4 $s^{-1}$
B=8.70E-8 $Pa^{-1}$
n=3.3

$$\frac{\Delta H}{R} = 8110 \text{ K}$$

Figure 8:
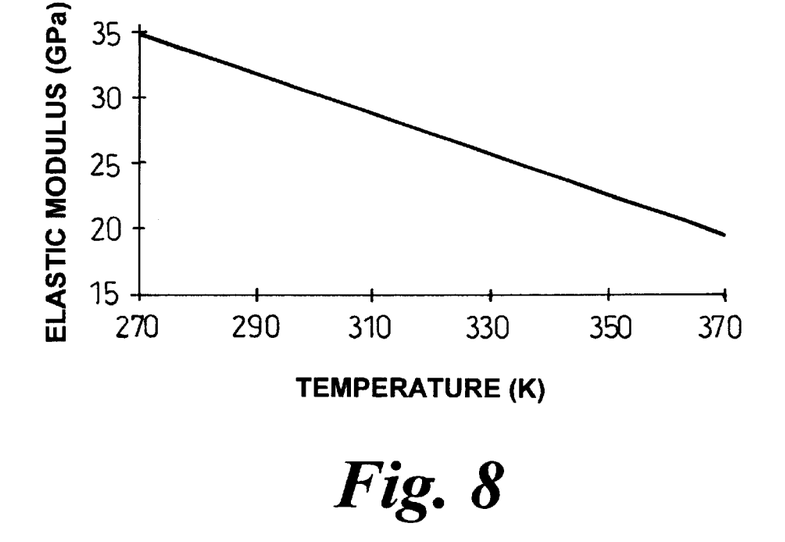
FIG. 8 shows a graph of the temperature-dependent modulus used in analysing the present embodiment.
Figure 9:
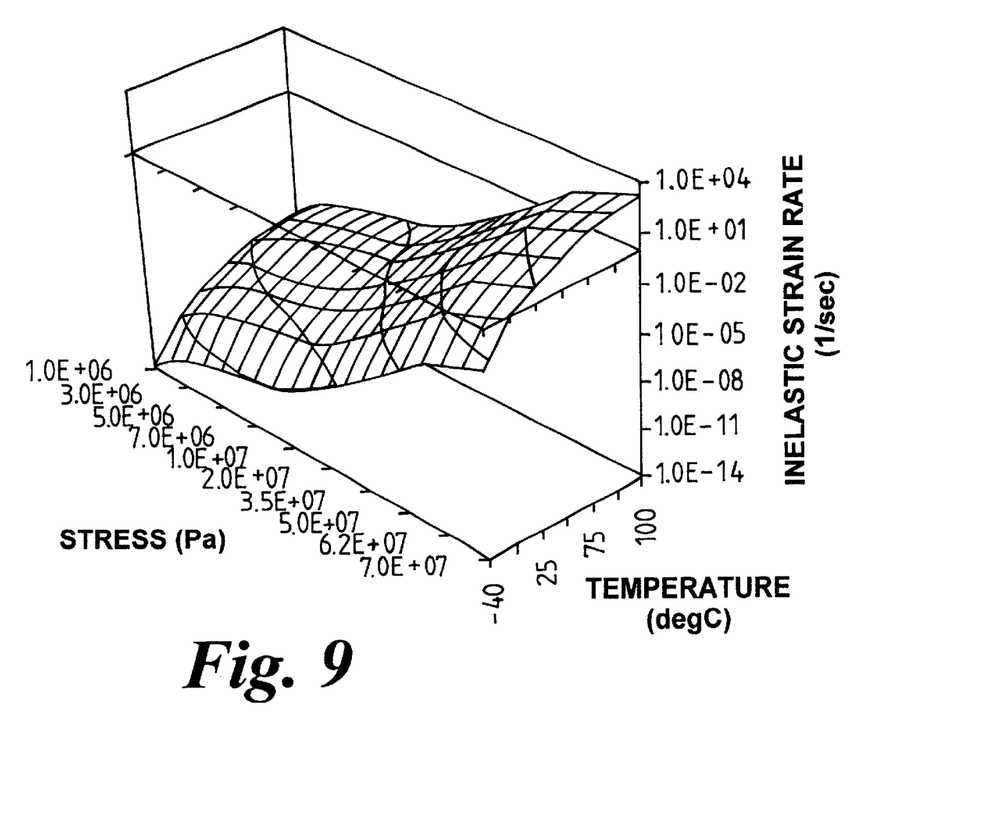
FIG. 9 shows a graph of the inelastic deformation data used in analysing the present embodiment.

The temperature-dependent modulus and the inelastic deformation plots used in the FE model are shown in FIG. 8 and 9 respectively. The elastic modulus descends uniformly from 34.9 GPa at 270K to 19.7 Gpa at 370K.

FIG. 9 shows a 3-D contour plot of creep strain rate vs. applied stress over the temperature range −40° C. to +100° C. using equation (1) with the specified constants A, B, n, $\Delta H$ and R. The constant values are such that the creep strain rate includes the effect of time-independent plasticity resulting in the term inelastic strain rate, as shown in FIG. 9.

Displacement loads and temperature loads were each applied to each model. The specific FEA load conditions applied to each modelled assembly are shown in Table 4.

TABLE 4

FEA Load Conditions

| Operating condition | Initial Temperature | Thermal Profile NOTE 1 | Symmetry |
|---|---|---|---|
| FIELD $\Delta T$ = 35° C. 1 cpd | 323° K. over the complete model | 323° K. to 358° K. at a cycle period of 1 day applied to the complete model | One-eighth symmetry in X-dir. One-eighth symmetry in Z-dir. Neutral Point fix in Y-dir. |

Displacement loads were used both to simulate symmetry conditions along the X-axis and Z-axis and, additionally, to fix the point on the underside of the PWB directly beneath the neutral point of the package, whereby to prevent movement in the Y-direction and thus to prevent freebody rotation.

Temperature loads were used both to set up initial temperature conditions for the model under the Outdoor Use conditions and to simulate the thermal cycling profile for the specified field use conditions.

Figure 10:
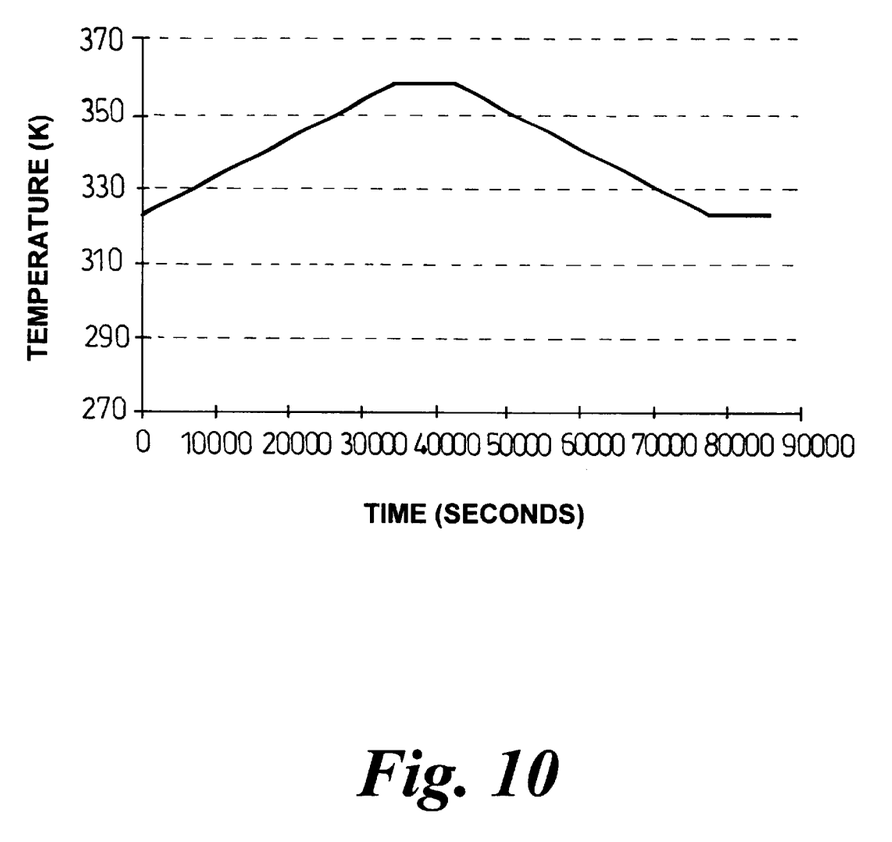
FIG. 10 shows a graph of the field use thermal profile data used in analysing the present embodiment.

The field use thermal profile, shown in FIG. 10, is based on the expected daily temperature excursion experienced by such packages. The temperature rises from a night-time low of 232K (50° C.) to a day-time high of 358K (85° C.) over a period of approximately 9.6 hours (34560s), maintains the high for approximately 2.4 hours (8640s) before descending again to the night-time low over a period of 9.6 hours and remaining there for 2.4 hours.

Creep analysis of each case, conducted as part of the structural analysis allowed modeling of the solder joint elastic and inelastic behaviour along with the elastic behaviour of the other materials being modelled. Both the plastic and the creep effects were incorporated into the creep equation in order to reduce the number of calculations required for the analysis.

In conducting the creep analysis the following parameters were adopted: elastic deformation for all package materials except for the solders; creep deformation model (as defined by Equation 1) for solders, with constants selected so as also to simulate the presence of time-independent plasticity.

Each analysis was run over two thermal cycles and the results obtained taken from the second cycle in order to bypass any unstable loading effects from the initial stress-free state. Fixed time increments were defined for the calculation points of each thermal cycle. These time increments were chosen to be small enough for the shape of the thermal cycle to be mapped to an acceptable degree and also to prevent computation failure due to non-convergence during analysis. Specifically, for a field cycle with a period of 1 day, the maximum time increment was fixed at 60 minutes so that the thermal cycle profile was defined by 24 calculation points.

The FE model was used to calculate the actual values from points inside the elements (the so-called Gauss points) which are often averaged out at the nodes for graphical display. The Gauss points can be averaged to give a single value at the centre of each element: the element centroid value. Although the Gauss points are more accurate than element centroid values, the latter are used because of the accuracy of the results is acceptable their calculation significantly less computational resources.

The representation of stress and strain values is based on the Von-Mises Yield Criterion, resulting in a convenient one-dimensional uni-axial stress or strain value which accounts for the multi-axial stress/strain states in a three-dimensional structure.

Each FEA was used to calculate stress values at all the Element Centroid points, inelastic strain values at all the Element Centroid points, and Von-Mises strain fringe plots. The Von-Mises plots give a convenient graphical representation of the strain distribution of the solder joints under the simulated thermal cycling conditions. This enables rapid identification or confirmation of which of the solder joints are most susceptible to failure so that subsequent fatigue life calculations can be performed solely on those critical joints.

For each of the 24 time steps in the cycle, the average stress and strain value was calculated for the elements representing each solder joint. Therefore, with 24 points in the stress/strain plane, the mean SED value can be calculated from the encompassed area in the stress/strain plane.

The SED value was subsequently used to obtain the $N_f(50)$ value for the most critical signal solder joint which is the outermost signal solder joint from the centre of gravity of the assembly, otherwise known as the maximum Distance from the Neutral Point (DNP).

The SED value is related to the $N_f(50)$ value by Equation 2:

$$N_f(50) = \frac{2.0\,E+8}{\Delta W} \quad (2)$$

in which:

$N_f(50)$=Number of cycles to 50% failures.

$\Delta W$=Mean Cyclic SED value per solder joint, obtained by FEA [Pa].

The risk or failure probability attached to telecommunications applications is 0.01% or 100 ppm. Using the Lognormal Failure Distribution (for background on which see "Accelerated Testing" by W. Nelson (Wiley, USA, 1990, Chapter 2), Equation 3 is used to calculate the required fatigue life at the 100 ppm failure rate, $N_f(0.01)$, from the $N_f(50)$ value:

$$N_f(0.01) = \frac{N_f(50)}{e^{(3.719\sigma)}} \quad (3)$$

In which, $N_f(0.01)$=Number of cycles to 0.01% failures (100 ppm failures)

$N_f(50)$=Number of cycles to 50% failures $\sigma$=Shape Factor=ln(standard deviation)

3.719=the standard normal distribution percentile value associated with a 0.01% failure rate.

The shape factor, $\sigma$, is typically either obtained from associated accelerated test data or estimated if no test data is available.

In the present instance, the failure distribution curve is based on the worst-case Weibull $\beta$ (shape factor) value expected from a copper leaded device (e.g. a Quad Flat Pack—a standard type of package). Therefore the value $\beta=3$ was assumed and the Lognormal equivalent shape factor value, $\sigma=0.45$ was obtained using Equation 4:

$$\sigma = 1.2 \cdot \beta^{(-0.9)} \quad (4)$$

in which, $\sigma$=Lognormal Shape Parameter $\beta$=Weibull Shape Parameter

The resulting shape factor, $\sigma=0.45$, is equivalent to a $N_f(50):N_f(0.01)$ ratio of 5.3:1 and is used to complete the fatigue life prediction using the $N_f(0.01)$ value.

The SED values obtained for each solder joint for each joint case showed that the greatest damage is attributed to the outermost signal joint. The resulting fatigue life values derived from the SED values are tabulated in Table 5.

TABLE 4

Expected Joint Fatigue Life

| Joint Case Number | Expected Fatigue Life (Years) |
| --- | --- |
| 1 | 125 |
| 2 | 94 |
| 3 | 60 |
| 4 | 30 |
| 5 | 53 |

The results for Cases 1–4 show that the minimum expected fatigue life decreases with joint size but, in case 5, the use of the larger Case 1 joints in conjunction with smaller case 4 joints offers significantly enhanced expected fatigue life over the smaller Case 4 joints alone. The case 5 larger ground joints provide additional stress relief to the smaller signal joints resulting in a 77% increase in fatigue life over the case 4 joints.

Consequently, in circumstances in which electrical performance requires relatively small joint sizes in order to avoid unwanted radiation, interspersing the small joints with larger reinforcing joints offers a practical means of mitigating the reduction in expected joint fatigue life that would otherwise arise if all joints were of the same, smaller size.

Furthermore, the extended expected fatigue life achieved by this method reduces, and some cases removes altogether, the need for underfill of such packages using epoxy resin. This not only reduces the cost of manufacture by removing the need for the resin, but also speeds manufacture by obviating the time taken to dispense and cure the resin. It also makes any re-work involving component removal and/or re-soldering simpler. Further, it reduces the cost of recall and repair of failed joints after installation in the field.

Figure 11A:
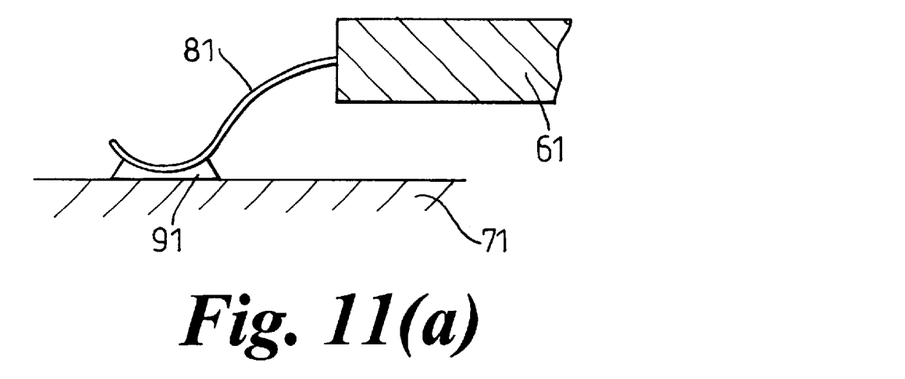
FIG. 11 shows partial cross section views of a range of surface-mount packages mounted on an underlying circuit board in accordance with the present invention.
Figure 11B:
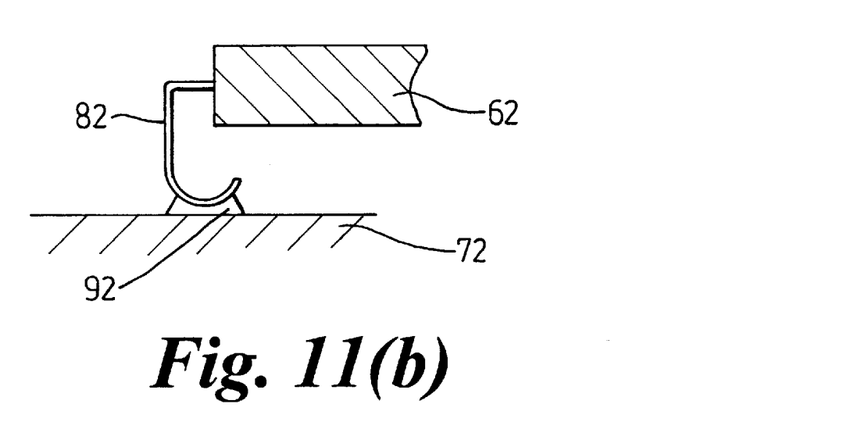
Figure 11C:
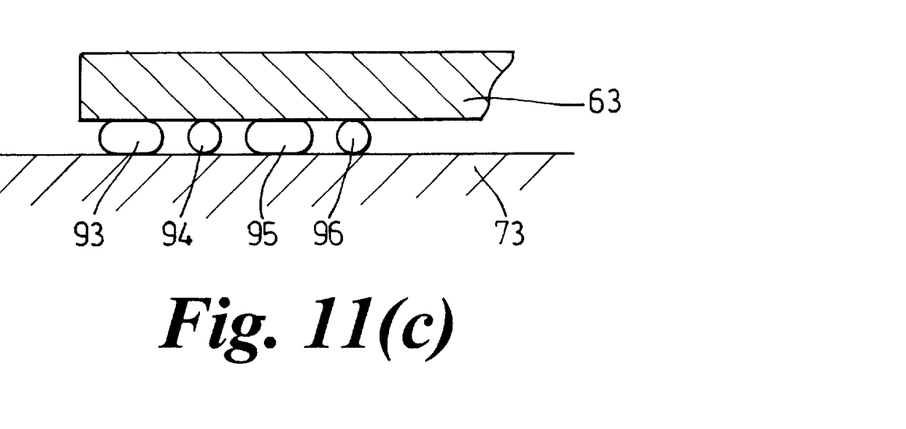

Whilst the specific embodiment described here relates to lead-less surface-mount peripheral packages, the same technique of utilising differently-sized solder joints according to the frequency of signal to be carried, may be applied to attachment of other surface-mount components to PWB's including, but not limited to, Ball Grid Array (BGA) packages (including flip-chip), land grid arrays, and leaded peripheral packages. FIGS. 11 a–c show partial cross-sectional views of a gull wing leaded peripheral package 61, a J-leaded peripheral package 62, and a ball grid array package 63 respectively, each mounted on corresponding underlying printed circuit boards 71–73. FIG. 11a shows a solder joint 91 connecting the underlying circuit board 71 via a gull wing lead 81 to the surface-mount package 61. Similarly FIG. 11b shows a solder joint 92 connecting an underlying circuit board 72 via a J-lead 82 to a surface-mount package 62. FIG. 11c shows solder joints 93–96 forming part of a ball grid array connecting an underlying circuit board 73 to a ball grid array package 63. FIG. 11c also illustrates the common situation that the joints are constrained to be of substantially the same height and consequently variations in the volume of the joints implies variation in the length and width of those joints rather than the height.

Whilst the specific embodiments described here relate to solder joints, the present invention is not limited to solder joints but also relates to joints of, for example, conductive adhesive materials, used to achieve electrical (including grounding) connection.

To create such joints of unequal cross-section, predetermined amounts of solder may be applied to each of the intended connection areas on the package (or alternatively on the PWB). The solder may be applied either by screen printing or by any other method which allows measured application over small disjoint areas.

The package may then be located on the PWB so that the solder is aligned between corresponding connections on the PWB and on the package between which electrical and mechanical connection is to be made. The solder may then be re-flowed: it is melted, causing the component to float on the board, and then cooled, or allowed to cool, until the solder forms solid joints between board and package, thereby providing the desired electrical and physical connection.

The volume of solder applied at each point is chosen both according to the surface area of the intended connection and according to the frequency of electrical signals to be carried through the corresponding resultant joint. Preferably, the volume of solder per unit area applied at each connection point varies inversely with the frequency of electrical signals to be carried so that a joint forming part of a high-frequency signal path will be small relative to a joint forming a grounding path between component and board.

In the case of peripheral packages, the solder joint cross-sections may also be varied by varying the curvature parameters of those portions of the package where solder connections are to be formed.

In the case of peripheral packages, or similarly formed components which are arranged to provide their own electromagnetic shielding, the introduction of larger grounding connections between the package and is the circuit board has the added advantage of enhancing the ground shielding of enclosed circuitry.

It is the cross-sectional shape and area (in the Y-Z plane as described above) of the joints that are significant in affecting the fatigue life expectancy of the joints. Two aims in determining the precise configuration are matching the impedance of the joint to that of the connected circuitry, and minimising the physical size of any discontinuity. The absolute scale is related to the wavelength in the medium.

The present method may also be used to create solder joints solely for purposes of thermal conduction where no electrical grounding or other electrical contact is required, but where the larger joints still provide strain relief for smaller joints.

In the case of BGA packages, solder may be applied in various sizes of eutectic solder balls, subsequently re-flowed to form the required electrical and mechanical connection.

In the case of pin-mount packages variation in the size of solder joints may be achieved by choosing different configurations of solder pads and solder resist so that the required differing volumes of solder are retained to for the requisite joints upon solidifying.

Any range or device value given herein may be extended or altered without losing the effect sought, as will be apparent to the skilled person for an understanding of the teachings herein.

What is claimed is:

1. An electrical circuit arrangement comprising:
a printed circuit board and
a surface-mount electrical component attached thereto by a plurality of electrically-conductive joints
wherein one dimension of one of said joints is predetermined from a characteristic of a signal to be conducted through said joint,
wherein a first joint is positioned adjacent to at least one larger joint whereby to afford strain relief to said first joint,
and wherein said larger joint is arranged, in operation, to form part of an electrical grounding or shielding member.

2. An arrangement according to claim 1 wherein a dimension of a number of joints is predetermined from a characteristic of respective signals to be conducted through said joints.

3. An arrangement according to claim 1 wherein said characteristic of a signal is the frequency of said signal.

4. An arrangement according to claim 1 wherein the size of said one dimension of said joint is determined to be inversely proportional to the frequency of an electrical signal to be conducted through said joint.

5. An arrangement according to claim 1 wherein said one dimension of said joint is the length of said joint.

6. An arrangement according to claim 1 wherein said first joint is positioned adjacent at least two larger joints.

7. An arrangement according to claim 1 wherein said first joint is arranged, in operation, to conduct high frequency electrical signals.

8. An arrangement according to claim 1 wherein said high-frequency electrical signals are radio frequency signals.

9. An arrangement according to claim 1 wherein said joints are of solder.

10. An arrangement according to claim 1 wherein said joints are of electrically-conductive adhesive.

11. A telecommunications network comprising one or more arrangements according to claim 1.

12. An electrical circuit arrangement comprising:
a printed circuit board and
a surface-mount electrical component attached thereto by a plurality of electrically-conductive joints,
wherein one dimension of one of said joints is predetermined from a characteristic of a signal to be conducted through said joint,
wherein a first joint arranged, in operation, to carry high frequency signals is positioned adjacent to at least one larger joint arranged, in operation, to carry signals having a frequency lower than the high frequency signals, whereby to afford strain relief to said first joint.

* * * * *